United States Patent
Fong et al.

(10) Patent No.: US 7,580,290 B2
(45) Date of Patent: *Aug. 25, 2009

(54) NON-VOLATILE STORAGE SYSTEM WITH INTELLIGENT CONTROL OF PROGRAM PULSE DURATION

(75) Inventors: Yupin Fong, Fremont, CA (US); Jun Wan, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 89 days.

This patent is subject to a terminal disclaimer.

(21) Appl. No.: 11/766,580

(22) Filed: Jun. 21, 2007

(65) Prior Publication Data

US 2008/0316832 A1 Dec. 25, 2008

(51) Int. Cl.
*G11C 16/04* (2006.01)

(52) U.S. Cl. .............. 365/185.19; 365/185.18; 365/185.23

(58) Field of Classification Search .......... 365/185.19, 365/185.18, 185.23

See application file for complete search history.

(56) References Cited

U.S. PATENT DOCUMENTS

| | | | |
|---|---|---|---|
| 6,744,670 B2 | 6/2004 | Tamada | |
| 6,882,567 B1 | 4/2005 | Wong | |
| 6,937,520 B2 | 8/2005 | Ono | |
| 7,020,026 B2 | 3/2006 | Guterman | |
| 7,038,949 B2 * | 5/2006 | Chae et al. | 365/185.23 |
| 7,054,193 B1 | 5/2006 | Wong | |
| 7,139,192 B1 | 11/2006 | Wong | |
| 7,339,834 B2 | 3/2008 | Lutze | |
| 7,345,923 B2 * | 3/2008 | Kim | 365/185.23 |
| 7,372,732 B2 | 5/2008 | Wu | |
| 2004/0190354 A1 | 9/2004 | Shim | |
| 2005/0270848 A1 | 12/2005 | Chae | |
| 2007/0058446 A1 | 3/2007 | Hwang | |

FOREIGN PATENT DOCUMENTS

| | | |
|---|---|---|
| EP | 0830684 B1 | 8/2004 |
| WO | 01/69604 | 9/2001 |

OTHER PUBLICATIONS

International Search Report dated Sep. 12, 2008, PCT Appl. PCT/US2008/067347, filed Jun. 18, 2008.
Written Opinion of the International Searching Authority dated Sep. 12, 2008, PCT Appl. PCT/US2008/067347, filed Jun. 18, 2008.
U.S. Appl. No. 11/766,583, filed on Jun. 21, 2007.
Office Action dated Feb. 4, 2009, U.S. Appl. No. 11/766,583, filed Jun. 21, 2007.
Response to Office Action dated Apr. 28, 2009, U,S, Appl. No. 11/766,583, file Jun. 21, 2007.

* cited by examiner

*Primary Examiner*—Connie C Yoha
(74) *Attorney, Agent, or Firm*—Vierra Magen Marcus & DeNiro LLP

(57) ABSTRACT

To program a set of non-volatile storage elements, a set of programming pulses are applied to the control gates (or other terminals) of the non-volatile storage elements. The programming pulses have a constant pulse width and increasing magnitudes until a maximum voltage is reached. At that point, the magnitude of the programming pulses stops increasing and the programming pulses are applied in a manner to provide varying time duration of the programming signal between verification operations. In one embodiment, for example, after the pulses reach the maximum magnitude the pulse widths are increased. In another embodiment, after the pulses reach the maximum magnitude multiple program pulses are applied between verification operations.

22 Claims, 12 Drawing Sheets

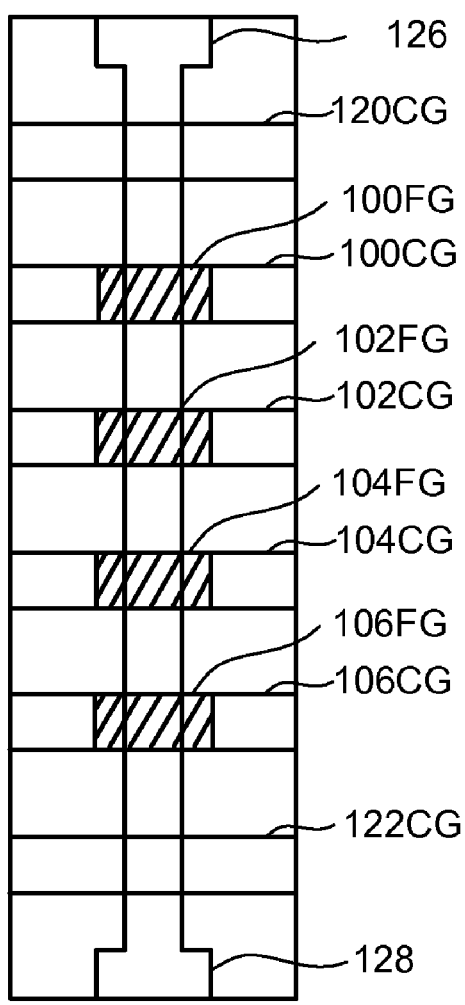
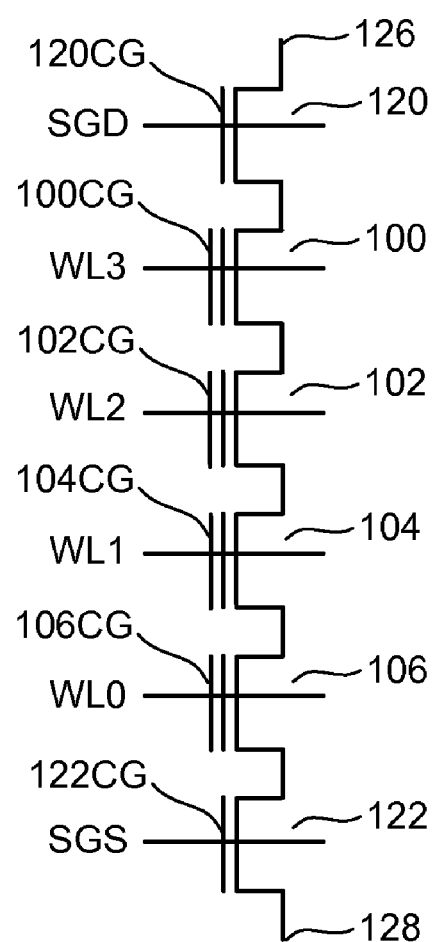
Fig. 1
Fig. 2

Fig 6
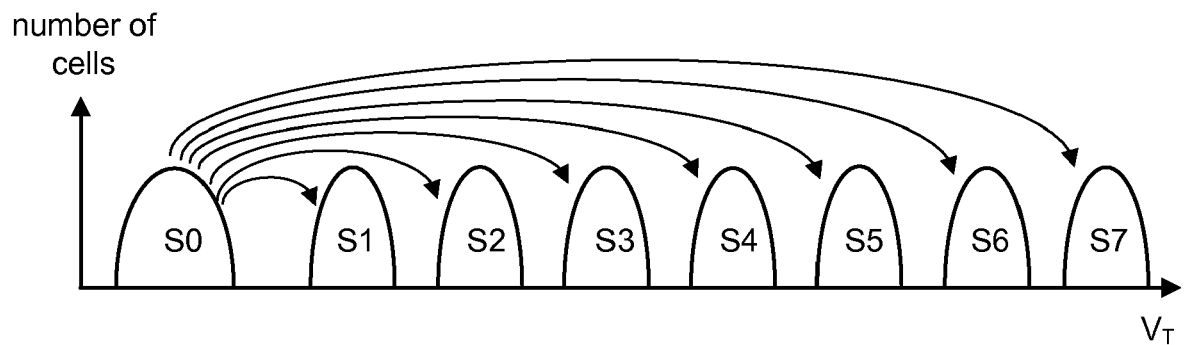
number of cells
S0 S1 S2 S3 S4 S5 S6 S7
$V_T$
Fig. 9
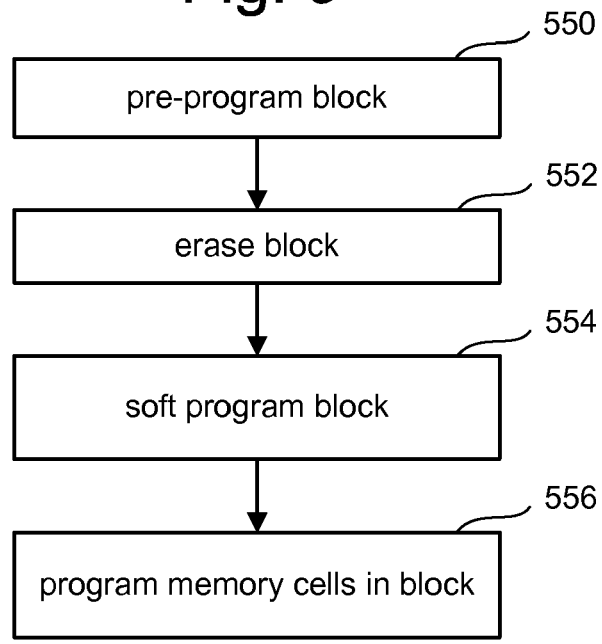
550 pre-program block
552 erase block
554 soft program block
556 program memory cells in block
Fig 8
|     | First Page | Second Page | Third Page |
|-----|------------|-------------|------------|
| WL0 | 1          | 3           | 6          |
| WL1 | 2          | 5           | 9          |
| WL2 | 4          | 8           | 11         |
| WL3 | 7          | 10          | 12         |

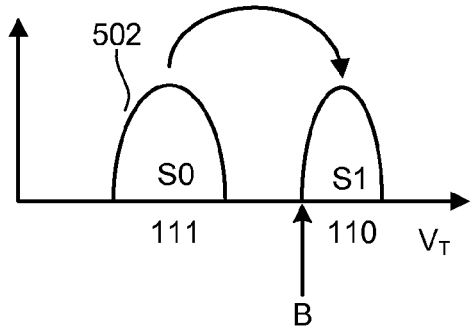
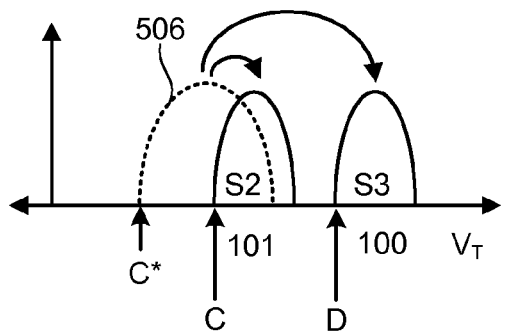
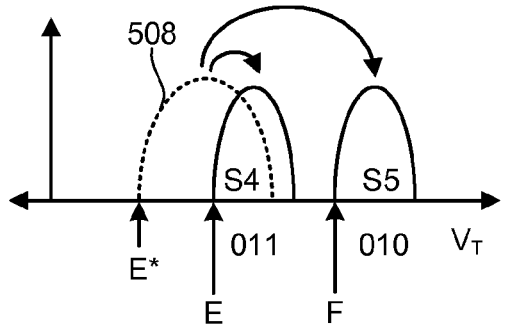
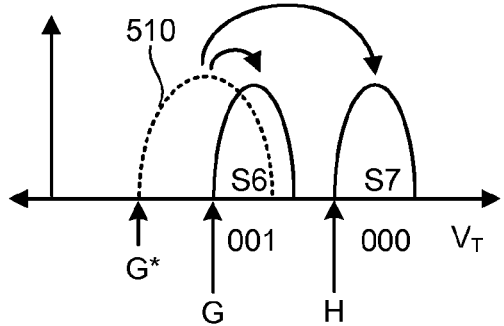
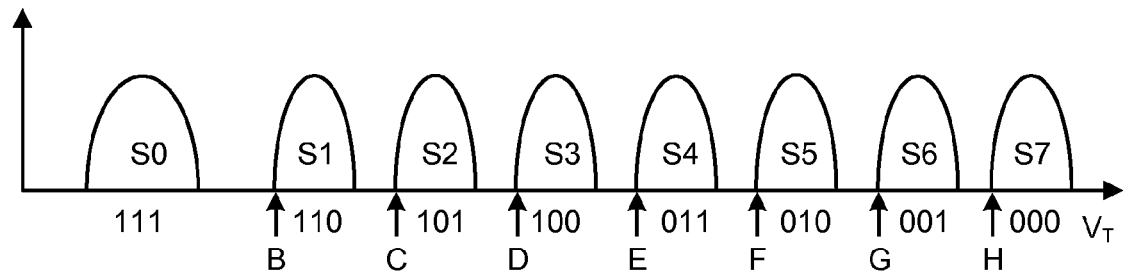

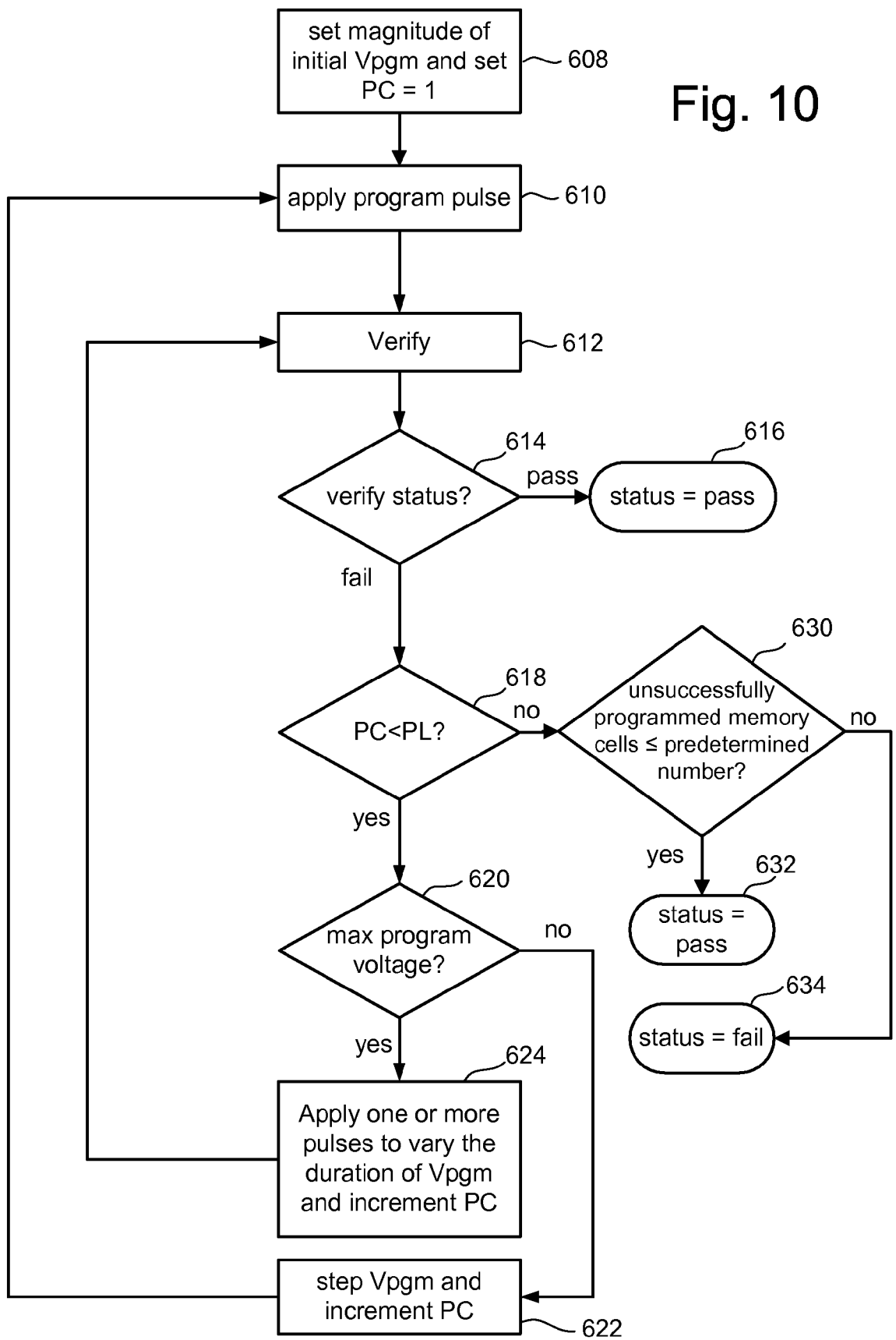

Fig. 14

| Pulse # | Magnitude (volts) | Pulse Width (us) | Avg. Vth (volts) |
|---|---|---|---|
| 1 | 17.00 | 10.0 | -2.25 |
| 2 | 17.25 | 10.0 | -2.00 |
| 3 | 17.50 | 10.0 | -1.75 |
| 4 | 17.75 | 10.0 | -1.50 |
| 5 | 18.00 | 10.0 | -1.25 |
| 6 | 18.25 | 10.0 | -1.00 |
| 7 | 18.50 | 10.0 | -0.75 |
| 8 | 18.75 | 10.0 | -0.50 |
| 9 | 19.00 | 10.0 | -0.25 |
| 10 | 19.25 | 10.0 | 0.00 |
| 11 | 19.50 | 10.0 | 0.25 |
| 12 | 19.75 | 10.0 | 0.50 |
| 13 | 20.00 | 10.0 | 0.75 |
| 14 | 20.25 | 10.0 | 1.00 |
| 15 | 20.50 | 10.0 | 1.25 |
| 16 | 20.75 | 10.0 | 1.50 |
| 17 | 21.00 | 10.0 | 1.75 |
| 18 | 21.25 | 10.0 | 2.00 |
| 19 | 21.50 | 10.0 | 2.25 |
| 20 | 21.75 | 10.0 | 2.50 |
| 21 | 22.00 | 10.0 | 2.75 |
| 22 | 22.25 | 10.0 | 3.00 |
| 23 | 22.50 | 10.0 | 3.25 |
| 24 | 22.75 | 10.0 | 3.50 |
| 25 | 23.00 | 10.0 | 3.75 |
| 26 | 23.25 | 10.0 | 4.00 |
| 27 | 23.25 | 13.8 | 4.25 |
| 28 | 23.25 | 19.4 | 4.50 |
| 29 | 23.25 | 27.6 | 4.75 |
| 30 | 23.25 | 39.0 | 5.00 |
| 31 | 23.25 | 56.4 | 5.25 |
| 32 | 23.25 | 82.4 | 5.50 | ns # NON-VOLATILE STORAGE SYSTEM WITH INTELLIGENT CONTROL OF PROGRAM PULSE DURATION

CROSS-REFERENCE TO RELATED APPLICATIONS

The following application is cross-referenced and incorporated by reference herein in its entirety: U.S. patent application No. 11,766,583, entitled "Intelligent Control of Program Pulse Duration," Inventors Yupin Fong and Jun Wan, filed on Jun. 21, 2007 incorporated herein by reference in its entirety.

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety.

Typically, the program voltage applied to the control gate during a program operation is applied as a series of pulses. In many implementations, the magnitude of the pulses is increased with each successive pulse by a predetermined step size.

Because multi-state memory cells have multiple ranges of possible threshold voltages, some memory cells will need to be programmed to a higher threshold voltage than in comparison to binary memory cells. Larger magnitude programming pulses are needed to program memory cells to higher threshold voltages. Additionally, as technology scales to finer geometries, it may be more difficult to maintain the same cell coupling ratio; thereby, requiring larger voltages for the programming pulses in order to achieve the same programming effect. The voltage of the programming pulses is, however, limited by a number of factors including practical limitations on the design of the charge pump on the memory chip, and junction and oxide breakdown.

Thus, while there is a need for higher voltage programming pulses, there is a limitation on the maximum voltage that can be achieved.

SUMMARY

The technology described herein pertains to an intelligent scheme for controlling the duration of program pulses experienced by the memory cell(s). For example, in the situation where the programming signal has reached its maximum voltage but there are still memory cells that have not finished programming, the intelligent scheme for controlling the duration of the program pulses experienced by the memory cell(s) can be used to continue effective programming. One example of the intelligent scheme for controlling the duration of the program pulses experienced by the memory cell(s) includes using wider program pulses. Another example uses multiple consecutive program pulses between verification operations.

Other intelligent schemes for controlling the duration of the program pulses can also be used. Additionally, the intelligent schemes for controlling the duration of the program pulses can also be used in situations other than those described above.

One embodiment includes a non-volatile storage element and one or more managing circuits in communication with the non-volatile storage element. The one or more managing circuits program the non-volatile storage element by applying a programming signal to the non-volatile storage element including applying programming pulses with a constant width to the non-volatile storage element prior to one or more pulses reaching a maximum magnitude and applying one or more programming pulses to the non-volatile storage element that provide varying time duration of the programming signal between verification operations subsequent to one or more pulses reaching a maximum magnitude.

One embodiment includes a plurality of non-volatile storage elements, means for applying a programming signal as a set of pulses to the plurality of non-volatile storage elements, and means for performing one or more verification operations to determine if the non-volatile storage elements have been properly programmed. The means for applying the programming signal as the set of pulses applies pulses with increasing magnitudes and with a fixed pulse width between verification operations prior to one or more pulses reaching a maximum magnitude. The means for applying the programming signal as the set of pulses varies time duration of the programming signal between verification operations subsequent to one or more pulses reaching the maximum magnitude One embodiment includes a non-volatile storage element and one or more managing circuits in communication with the non-volatile storage element. The one or more managing circuits apply a set of programming pulses with increasing magnitudes and a constant pulse width to a non-volatile storage element until one or more pulses reaches a maximum magnitude. The one or more managing circuits apply a set of one or more programming pulses to the non-volatile storage element with changing pulse widths subsequent to one or more pulses reaching the maximum magnitude.

One embodiment includes a non-volatile storage element and one or more managing circuits in communication with the non-volatile storage element. The one or more managing circuits apply a set of programming pulses with increasing magnitudes and a constant pulse width to the non-volatile storage elements until one or more pulses reaches a maximum magnitude and then apply one or more groups of different numbers of programming pulses to the non-volatile storage element. Each group is applied between verify operations.

BRIEF DESCRIPTION OF THE DRAWINGS

FIG. 1 is a top view of a NAND string.
FIG. 2 is an equivalent circuit diagram of the NAND string.
FIG. 6 depicts an example set of threshold voltage distributions and describes a process for programming non-volatile memory.
FIGS. 7A-I show various threshold voltage distributions and describe a process for programming non-volatile memory.
FIG. 8 is a table depicting one example of an order of programming non-volatile memory.

FIG. 9 depicts a flow chart describing one embodiment of a process for programming non-volatile memory.
FIG. 10 depicts a flow chart describing one embodiment of a process for programming non-volatile memory elements.
FIG. 14 is a table that provides data for an example programming signal.

DETAILED DESCRIPTION

Figure 3:
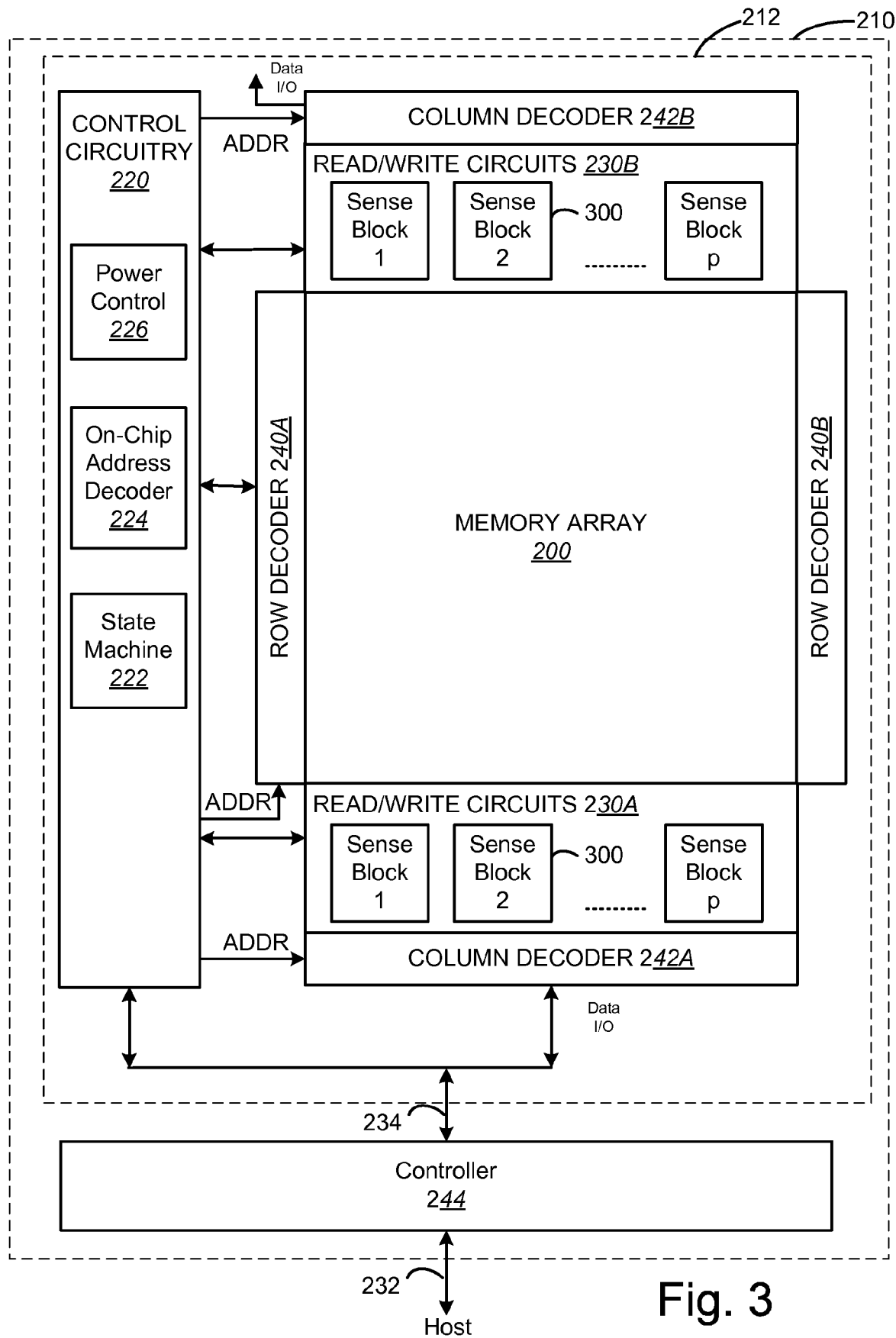
FIG. 3 is a block diagram of a non-volatile memory system.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. patents/patent applications, all of which are incorporated herein by reference: U.S. Pat. Nos. 5,570,315; 5,774,397; 6,046,935; 6,456, 528; and U.S. Pat. Publication No. US2003/0002348. The discussion herein can also apply to other types of flash memory in addition to NAND, as well as other types of non-volatile memory.

Other types of non-volatile storage devices, in addition to NAND flash memory, can also be used. For example, a so-called TANOS structure (consisting of a stacked layer of TaN—Al$_2$O$_3$—SiN—SiO$_2$ on a silicon substrate), which is basically a memory cell using trapping of charge in a nitride layer (instead of a floating gate), can also be used with the present invention. Another memory cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

FIG. 3 illustrates a memory device 210 having read/write circuits for reading and programming a page of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
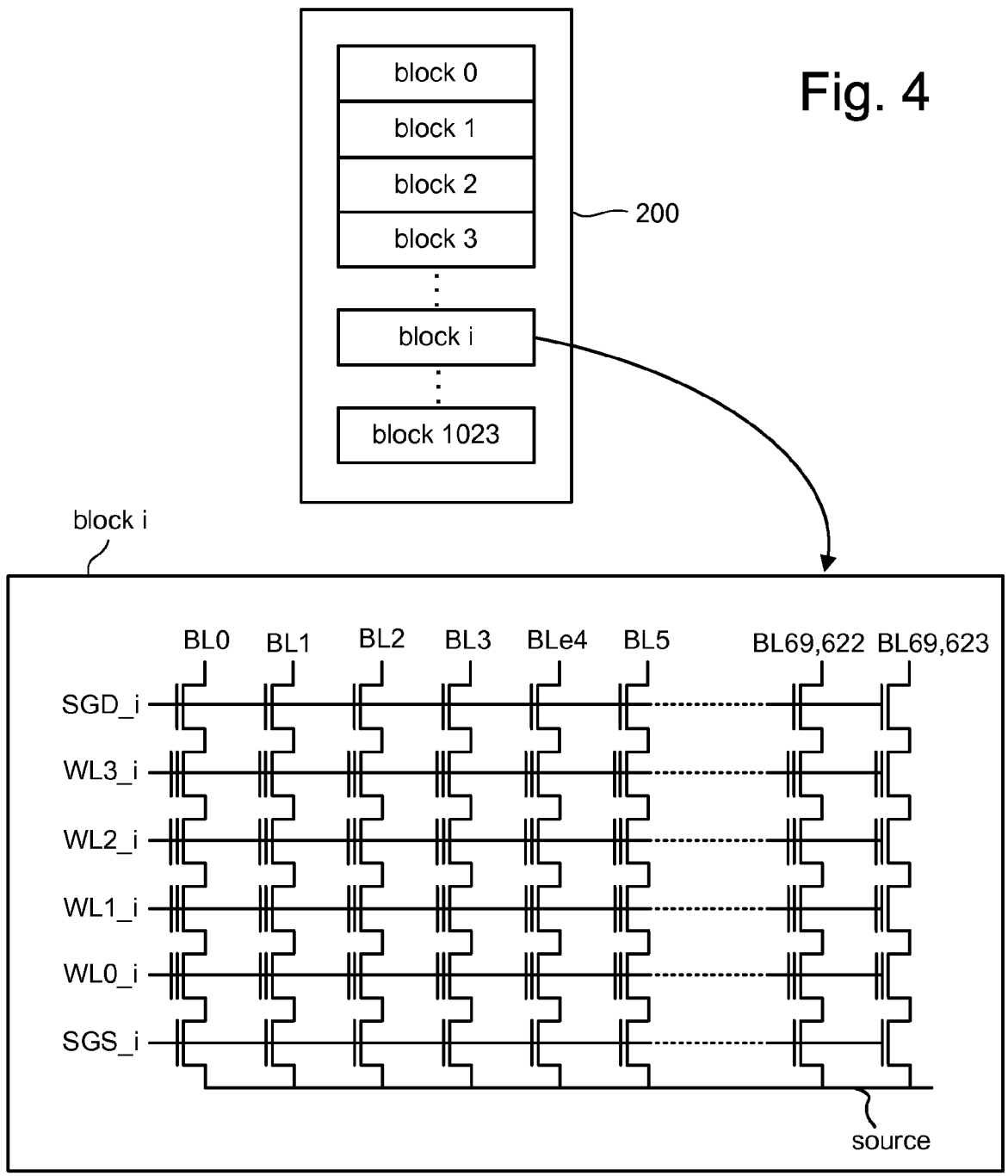
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together.

A block contains a set of NAND stings which are accessed via bit lines (e.g., bit lines BL0-BL69623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

Each block is typically divided into a number of pages. In one embodiment, a page is a unit of programming. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 5:
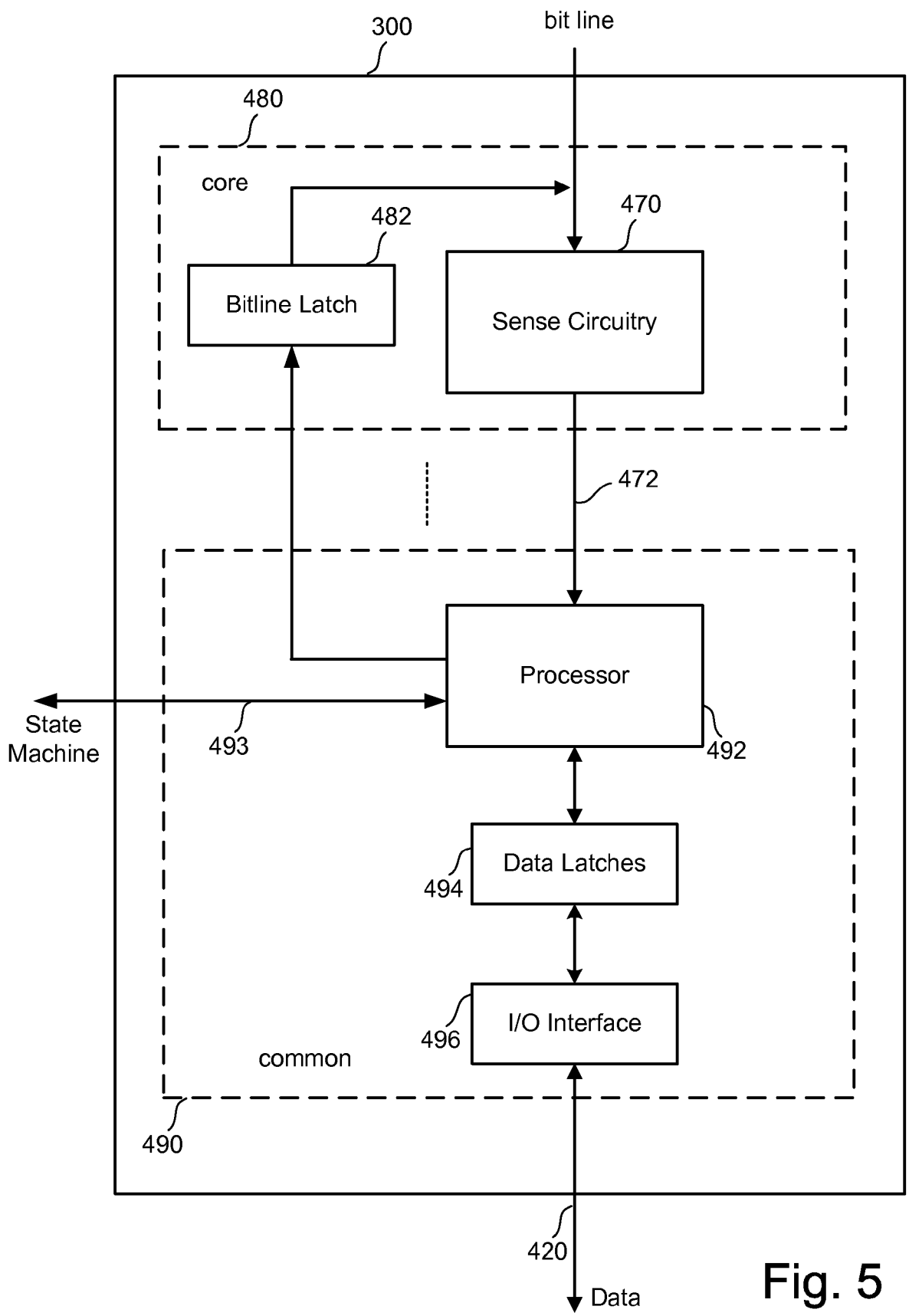
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (or data states) for the memory cell array when each memory cell stores three bits of data. Other embodiment, however, may use more or less than three bits of data per memory cell (e.g., such as four or more bits of data per memory cell).

In the example of FIG. 6, each memory cell stores three bits of data; therefore, there are eight valid data states S0-S7. In one embodiment, data state S0 is below 0 volts and data states S1-S7 are above 0 Volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell correspond to different pages. Thus, a memory cell storing three bits of data would include data in a first page, a second page and a third page. In some embodiments, all of the memory cells connected to the same word line would store data in the same three pages of data. In some embodiments, the memory cells connected to a word line can be grouped in to different sets of pages (e.g., by odd and even bit lines).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 6.

FIGS. 7A-7I disclose another process for programming non-volatile memory that reduces the effect of floating gate to floating gate coupling by, for any particular memory cell, writing to that particular memory cell with respect to a particular page subsequent to writing to adjacent memory cells for previous pages. The process of FIGS. 7A-7I is a three step programming process. Prior to the first step, the memory cells will be erased so that they are in the erase threshold distribution of state S0.

The process of FIGS. 7A-7I assumes that each memory cell stores three bits of data, with each bit being in a different page. The first bit of data (the leftmost bit) is associated with the first page. The middle bit is associated with the second page. The rightmost bit is associated with the third page. The correlation of data states to data is as follows: S0=111, S1=110, S2=101, S3=100, S4=011, S5=010, S6=001 and S7=000. However, other embodiments can use other data encoding schemes.

Figure 7A:
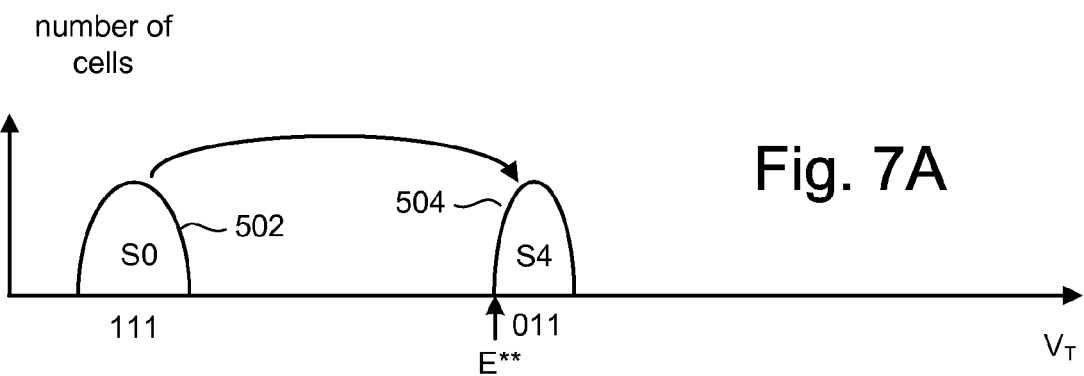
Figure 7B:
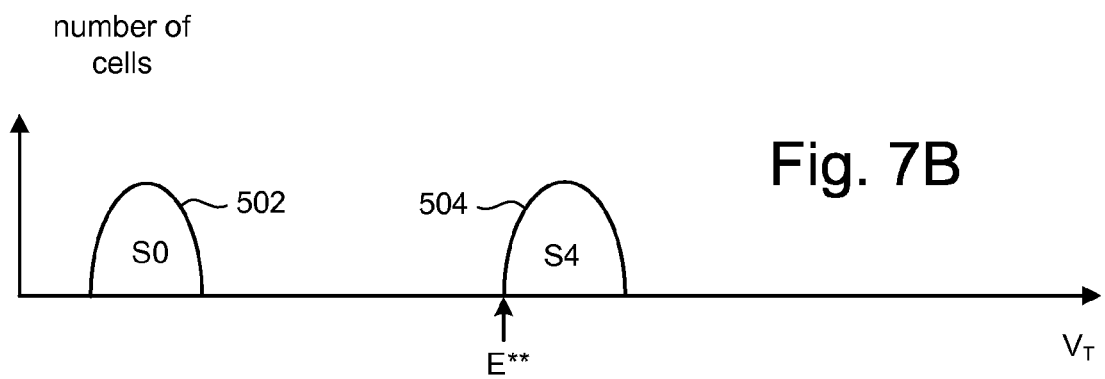

When programming the first page (as described in FIG. 7A), if the bit is to be data "1" then the memory cell will stay in state S0 (threshold voltage distribution 502). If the bit is to be data "0" then the memory cell is programmed to state S4 (threshold voltage distribution 504). After adjacent memory cells are programmed, capacitive coupling between adjacent floating gates may cause the state S4 to widen as depicted in FIG. 7B. State S0 may also widen, but there is sufficient margin between S0 and S1 to ignore the effect. More information about capacitive coupling between adjacent floating gates can be found in U.S. Pat. Nos. 5,867,429 and 6,657,891, both of which are incorporated herein by reference in their entirety.

Figure 7C:
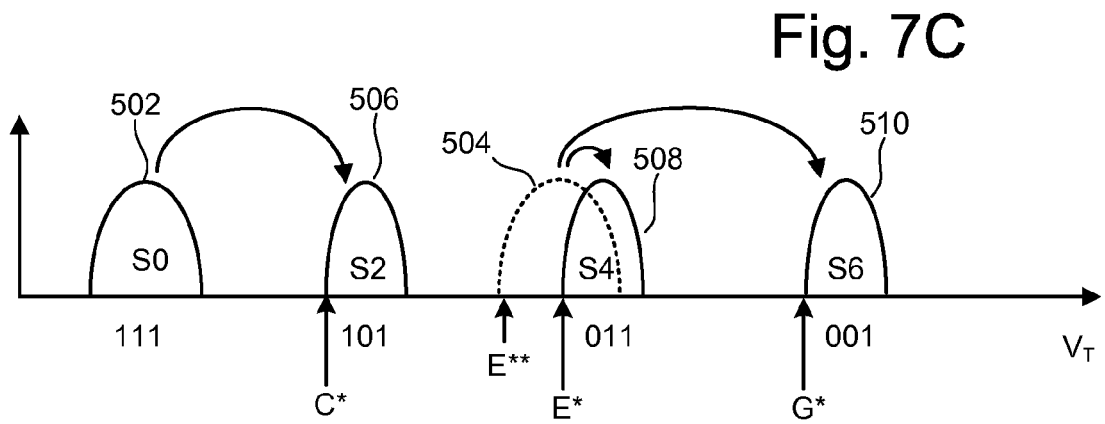

When programming the second page (see FIG. 7C), if the memory cell is in state S0 and the second page bit is data "1" then the memory cell stays in state S0. In some embodiments, the programming process for the second page will tighten threshold voltage distribution 501 to a new S0. If the memory cell was in state S0 and the data to be written to the second page is "0", then the memory cell is moved to state S2 (threshold voltage distribution 506). State S2 has a verify point (lowest voltage) of C*. If the memory cell was in state S4 and the data to be written to the memory cell is "1" then the memory cell remains in S4. However, state S4 is tightened by moving the memory cells from threshold voltage distribution 504 to threshold voltage distribution 508 for state S4, as depicted in FIG. 7C. Threshold voltage distribution 508 has a verify point of E* (as compared to E** of threshold voltage distribution 504). If the memory cell is in state S4 and the data to be written to the second page is a "0" then the memory cell has its threshold voltage moved to state S6 (threshold voltage distribution 510), with a verify point of G*.

Figure 7D:
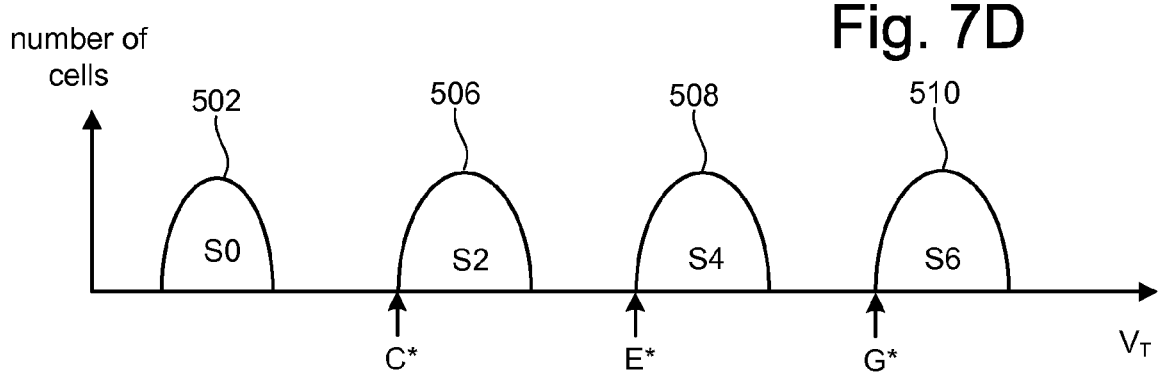

After the adjacent memory cells are programmed, the states S2, S4 and S6 are widened due to the floating gate to floating gate coupling, as depicted by threshold voltages distributions 506, 508 and 510 of FIG. 7D. In some cases, state S0 may also widen.

FIGS. 7E, 7F, 7G and 7H depict the programming of the third page. While one graph can be used to show the programming, the process is depicted in four graphs for visibility reasons. After the second page has been programmed, the memory cells are either in states S0, S2, S4 or S6. FIG. 7E shows the memory cell that is in state S0 being programmed for the third page. FIG. 7F shows the memory cell that is state S2 being programmed for the third page. FIG. 7G shows the memory cell that is in state S4 being programmed for the third page. FIG. 7H shows the memory cell that is in state S6 being programmed for the third page. FIG. 7I shows the threshold voltage distributions after the processes of FIGS. 7E, 7F, 7G and 7H have been performed on the population of memory cells (concurrently or serially).

If the memory cell is in state S0 and the third page data is "1" then the memory cell remains at state S0. If the data for the third page is "0" then the threshold voltage for the memory cell is raised to be in state S1, with a verify point of B (see FIG. 7E).

If the memory cells in state S2 and the data to be written in the third page is "1", then the memory cell will remain in state S2 (see FIG. 7F). However, some programming will be performed to tighten the threshold distribution 506 to a new state S2 with a verify point of C volts. If the data to be written to the third page is "0," then the memory cell will be programmed to state S3, with a verify point of D volts.

If the memory cell is in state S4 and the data to be written to the third page is "1" then the memory cell will remain in state S4 (see FIG. 7G). However, some programming will be performed so that threshold voltage distribution 508 will be tightened to new state S4 with a verify point of E. If the memory cell is in state S4 and the data to be written to the third page is "0" then the memory cell will have its threshold voltage raised to be in state S5, with a verify point of F.

If the memory cell is in state S6 and the data to be written to the third page is "1" then the memory cell will remain in state S6 (see FIG. 7H). However, there will be some programming so that the threshold voltage distribution 510 is tightened to be in new state S6, with a verify point at G. If the third page data is "0" then the memory cell will have its threshold voltage programmed to state S7, with a verify point at H. At the conclusion of the programming of the third page, the memory cell will be in one of the eight states depicted in FIG. 7I.

FIG. 8 depicts the one example of an order for programming the pages of a set or memory cells. The table provides the order for programming with respect to the four word lines (WL0, WL1, WL2 and WL3) of FIG. 4; however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, etc.

FIG. 9 is a flow chart describing a programming process for programming memory cells connected to a selected word line. In one embodiment, the process of FIG. 9 is used to program a block of memory cells. In one implementation of the process of FIG. 9, memory cells are pre-programmed in order to maintain even wear on the memory cells (step 550). In one embodiment, the memory cells are preprogrammed to state 7, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of cells. In one embodiment, after erasing the memory cells, all of the erased memory cells will be in state S0 (see FIG. 6).

At step 554, soft programming is performed to narrow the distribution of erased threshold voltages for the erased memory cells. Some memory cells may be in a deeper erased state than necessary as a result of the erase process. Soft programming can apply programming pulses to move the threshold voltage of the erased memory cells closer to the erase verify level. For example, looking at FIG. 6, step 554 can include tightening the threshold voltage distribution associated with state S0. In step 556, the memory cells of the block are programmed as described herein. The process of FIG. 9 can be performed at the direction of the state machine using the various circuits described above. In other embodiments, the process of FIG. 9 can be performed at the direction of the controller using the various circuits described above. After performing the process of FIG. 9, the memory cells of the block can be read.

FIG. 10 is a flow chart of process for performing programming on memory cells connected to a common word line. The process of FIG. 10 can be performed one or multiple times during step 556 of FIG. 9. For example, the process of FIG. 10 can be used to perform the full sequence programming of FIG. 6, in which case the process of FIG. 10 would be performed once for each word line. In one embodiment, the programming process is performed in an order that starts from the word line closest to the source line, working toward the bit line. The process of FIG. 10 can also be used to perform the programming of a page of data for a word line, with respect to the programming process of FIGS. 7A-I, in which case the process of FIG. 10 would be performed three times for each word line. Other arrangements can also be used.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 608, the programming voltage (Vpgm) is initialized to the starting magnitude (e.g., ~12V or another suitable level) and a program counter PC maintained by state machine 222 is initialized at 1. At step 610, a program pulse of the program signal Vpgm is applied to the selected word line (the word line selected for programming). The unselected word lines receive one or more boosting voltages (e.g., ~8 volts) to perform boosting schemes known in the art. If a memory cell should be programmed, then the corresponding bit line is grounded. On the other hand, if the memory cell should remain in its current data state, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

At step 612, the states of the selected memory cells are verified using the appropriate set of target levels. If it is detected that the threshold voltage of a selected memory cell has reached the appropriate target level, then the memory cell is locked out of further programming by, for example, raising its bit line voltage during subsequent programming pulses. In step 614, it is checked whether all of memory cells have reached their target threshold voltages. If so, the programming process is complete and successful because all selected memory cells were programmed and verified to their target states. A status of "PASS" is reported at step 616. Note that in some implementations, at step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, at step 614, it is determined that not all of the memory cells have reached their target threshold voltages, then the programming process continues. At step 618, the program counter PC is checked against a program limit value (PL). One example of a program limit value is 20; however, other values can be used in various implementations. If the program counter PC is not less than the program limit value, then it is determined at step 630 whether the number of memory cells that have not been successfully programmed is equal to or less than a predetermined number. If the number of unsuccessfully programmed memory cells is equal to or less than the predetermined number, then the programming process is flagged as passed and a status of PASS is reported at step 632. In many cases, the memory cells that are not successfully programmed can be corrected using error correction during the read process. If however, the number of unsuccessfully programmed memory cells is greater than the predetermined number, the program process is flagged as failed and a status of FAIL is reported at step 634.

If in step 618 it is determined that the program counter PC is less than the program limit value PL, then in step 620 the system determines whether the program voltage has reached its maximum level (referred to as the maximum program voltage). For example, in some memory systems a charge pump is used to create the programming voltages from the supply voltage. This charge pump may have a maximum voltage or the system may impose a maximum voltage that can be applied to the word lines. If the programming voltage being applied to the selected word line is not yet at the maximum program voltage, then the magnitude of the next program signal (Vpgm) voltage pulse is increased by the step size (e.g., 0.2-0.4 volt step size) and the program counter PC is incremented at step 622. In one embodiment, the pulse width is not changed in step 622. After step 622, the process loops back to step 610 to apply the next Vpgm voltage pulse.

If, in step 620, it is determined that the magnitude of programming voltage has reached (or exceeds) the maximum program voltage, then one or more programming pulses are applied in order to vary the time duration of the programming signal Vpgm between verification operations (step 624). For example, the amount of the programming voltage applied to the selected memory cells between verify operations (e.g., between iterations of step 612) is increased by using wider programming pulses or using multiple programming pulses. When using multiple programming pulses to increase the amount of the programming voltage applied to the selected memory cells, the system will not perform verify operations between the multiple pulses of a group of pulses. Rather, one or more verify operations will be performed prior to the group of multiple pulses (last iteration of step 612) and one or more verify operations will be performed after the group of multiple pulses (next iteration of step 612). Whether using wider pulses or multiple pulses, the magnitude of the program pulse will be at or lower than the maximum program voltage.

One purpose of step 624 is to intelligently control the increase of the threshold voltage of the memory cells being programmed. In some embodiments that use a programming signal that is a series of pulses with magnitudes that increase with each successive pulse by a predetermined step size, on average the memory cells that are being programmed will have their threshold voltage increased by the step size in response to each pulse. Once the magnitude of the program pulses reaches the maximum program voltage, the pulse width of the pulses can be widened (rather than increasing the magnitude of the pulses) in order to maintain the same rate of increase of the threshold voltage of the memory cells being programmed. Alternatively, multiple program pulses can be applied to achieve the same effect as widening the pulse width. Either way, the duration of the programming voltage applied to the selected memory cells between verify operations is increased. While in some embodiments step 624 is used to maintain the same rate of increase of the threshold voltage as achieved prior to reaching the maximum program voltage, other embodiments seek to control the rate of increase of the threshold voltage using other strategies.

Step 624 also includes incrementing the program counter. After step 624, the process of FIG. 10 continues with one or more verification operations at step 612.

Step 612 of FIG. 10 includes performing one or more verify operations. In general, during verify operations and read operations, the selected word line is connected to a voltage, a level of which is specified for each read and verify operation (e.g. see B, C, D, E, F, G and H of FIG. 7I) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not.

Figure 11A:
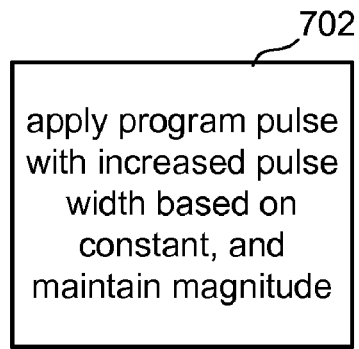
FIG. 11A depicts a flow chart describing one embodiment of a process for increasing duration of the program voltage.
Figure 11B:
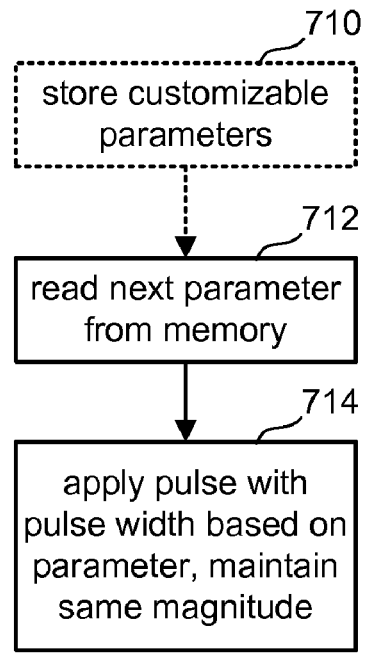
FIG. 11B depicts a flow chart describing one embodiment of a process for increasing duration of the program voltage.
Figure 11C:
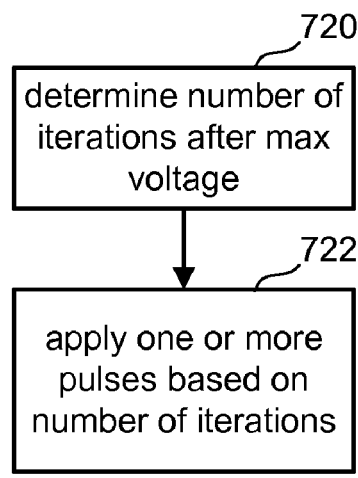
FIG. 11C depicts a flow chart describing one embodiment of a process for increasing duration of the program voltage.

FIGS. 11A-C are flow charts describing various embodiments for increasing duration of the program signal. That is, each of the flow charts of FIGS. 11A-C provide an example of the process performed as part of step 624 of FIG. 10.

The embodiment of FIG. 11A includes using wider pulses after reaching the maximum program voltage. In step 702 of the process of FIG. 11A, the pulse width of the next programming pulse is increased based on a constant. The constant can be an absolute value or a percentage of the previous pulse width. For example, the pulse width could increase by X time units or by Y % from the previous pulse width. Step 702 includes applying the program pulse at the new wider pulse width. In one embodiment, the program pulse is applied at a magnitude at (or near) the maximum program voltage. In other embodiments, other magnitudes can be used. The process of FIG. 11A would be performed during step 624 for each iteration of the loop of the process of FIG. 10 after Vpgm reaches the maximum program voltage. In one embodiment, step 702 includes configuring a charge pump.

Figure 12:
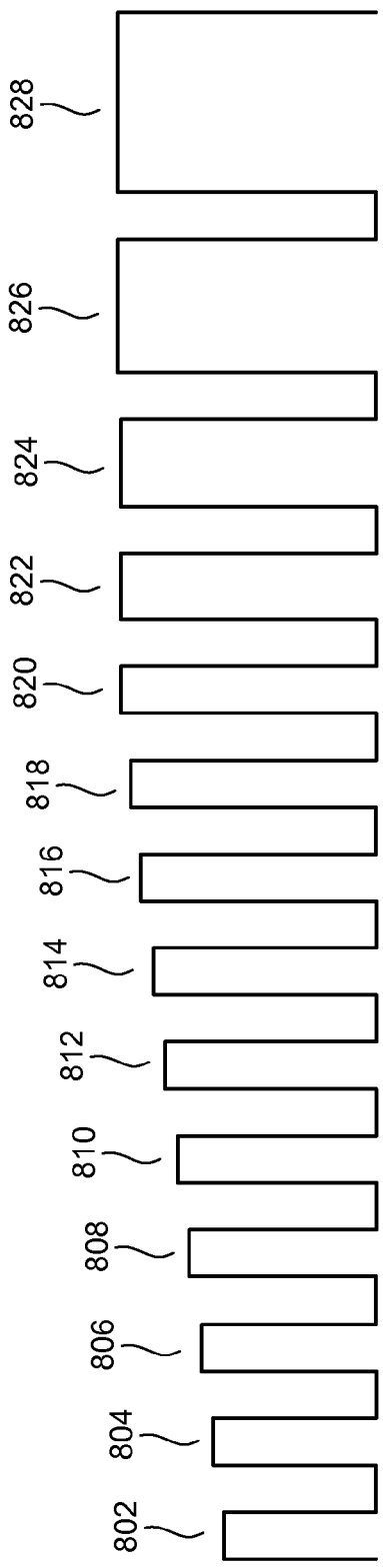
FIGS. 12-13 depict example waveforms.

FIG. 12 provides a graphical representation of an example of a programming signal according to the embodiment of FIG. 11A. Programming pulses 802, 804, 806, 808, 810, 812, 814, 816, 818, and 820 represent pulses that have a fixed pulse width and magnitudes that increase by a fixed step size. The magnitude of pulse 820 is at the maximum program voltage. Looking back at FIG. 10, prior to applying pulse 820, step 620 will always result in proceeding to step 622 and increasing the magnitude by the step size (and keeping the pulse width constant). After applying pulse 820 and performing verification, step 620 will result in performing step 624, at which time the pulse width will be increased (step 702) and the magnitude of the pulse will remain constant at the maximum program voltage for each pulse. As depicted in FIG. 12, pulse 822 has a wider pulse width than pulse 820, pulse 824 has a wider pulse width than pulse 822, pulse 826 has a wider pulse width than pulse 824, and pulse 828 has a wider pulse width than pulse 826. The magnitudes of pulses 822, 824, 826 and 828 all have a magnitude at the maximum program voltage. In one embodiment, not all of the pulses after reaching the maximum program voltage need to include a larger pulse width.

Figure 13:
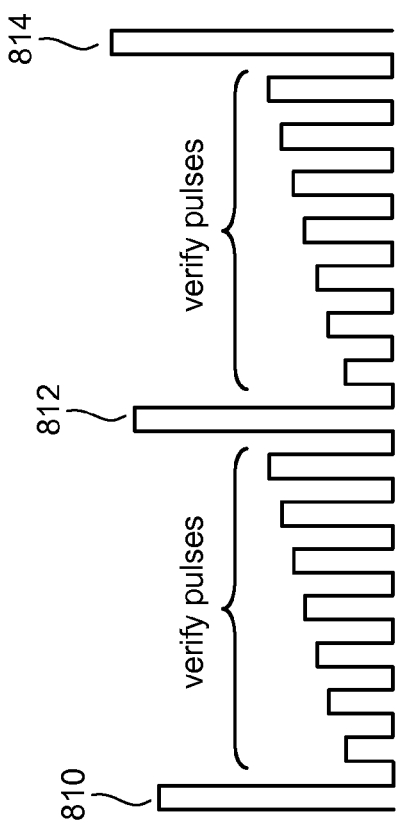

As discussed above, between programming pulses are one or more verify pulses. For example, seven verify pulses may be used at magnitudes of B, C, D, E, F, G and H volts (see FIG. 7I). These verify pulses are not depicted in FIG. 12 to make the drawing easier to read. However, FIG. 13 depicts three of the programming pulses 810, 812, and 814 with seven verify pulses (and, thus, seven verify operations) between pulses 810/812 and between pulses 812/814.

FIG. 14 is a table that provides another example of a programming signal according to the embodiment of FIG. 11A. The table provides example magnitudes and pulse widths for a programming signal. The table of FIG. 14 also provides an average threshold voltage (Vth) for a population of memory cells that are being programmed from the erased state. As can be seen in FIG. 14, prior to reaching the maximum program voltage of 23.25 volts, the program pulses increase in magnitude by a fixed step size of 0.25 volts, remain at a constant pulse width of 10.00 us, and cause the average threshold voltage to increase by 0.25 volts. After reaching the maximum program voltage of 23.25 volts, the magnitude of the program pulse remains at 23.25 volts; however, the pulse width of the program pulses increase so that the average threshold voltage continues to increase by 0.25 volts.

Note that in one embodiment, pulse #1 of FIG. 14 is not the first pulse applied. There may be previously applied pulses such that programming has reached a steady state by the 17.00 volt pulse.

FIG. 11B provides another embodiment of an implementation of step 624 of FIG. 10. In step 710, one or more customizable parameters are stored. These parameters indicate the pulse width sizes to use for pulses after reaching the maximum program voltage. For example, the one or more customizable parameters can include one parameter that indicates the step size for the increase in pulse widths or one parameter that indicates the percentage increase in pulse widths. In another embodiment, a parameter is stored for each pulse applied after reaching the maximum program voltage. Each parameter indicates the pulse width for its respective pulse. Step 710 of FIG. 11B is depicted with dotted lines to indicate that it may be performed at another time then the other steps of FIG. 11B. In one example, the customizable parameters are set during the manufacturing or test phase. In another embodiment, a user can set the parameters via the host device at any time.

In step 712, the system reads the parameter associated with the next programming pulse to be applied. In step 714, the next program pulse is applied with a pulse width that is set based on the parameter read in step 712. One embodiment includes configuring a charge pump circuit to adjust the pulse width. The process of FIG. 11B includes using the same magnitude for the pulses. For example, all of the pulses applied after reaching the maximum program voltage can have a magnitude equal to the maximum program voltage.

FIG. 11C provides another embodiment of an implementation of step 624 of FIG. 10 that includes applying multiple program pulses between verify operations to achieve a similar effect as widening the pulse width. In step 720, the system determines the number of iterations of the programming loop of FIG. 10 that have been performed since reaching the maximum program voltage. In step 722, one or more program pulses are applied based on the number of iterations determined in step 720. For example, after the maximum program voltage the system may then apply a set of two programming pulses at the maximum program voltage, followed by a set of three programming pulses at the maximum program voltage, followed by a set of four programming pulses at the maximum program voltage, etc. Step 722 will add the additional programming pulses to achieve the desired strategy of increasing the duration of the program voltage between verify operations. Between each set of programming pulses is a set of one or more verify operations. Within a set of programming pulses, the programming pulses are applied without performing verify operations. In one embodiment, the determination of how many program pulses to apply is made by incrementing the number of pulses for each iteration of the programming loop of FIG. 10 after reaching the maximum program voltage. In another embodiment, the customizable parameters (see FIG. 11B) can be used to identify how many program pulses to use.

Figure 15:
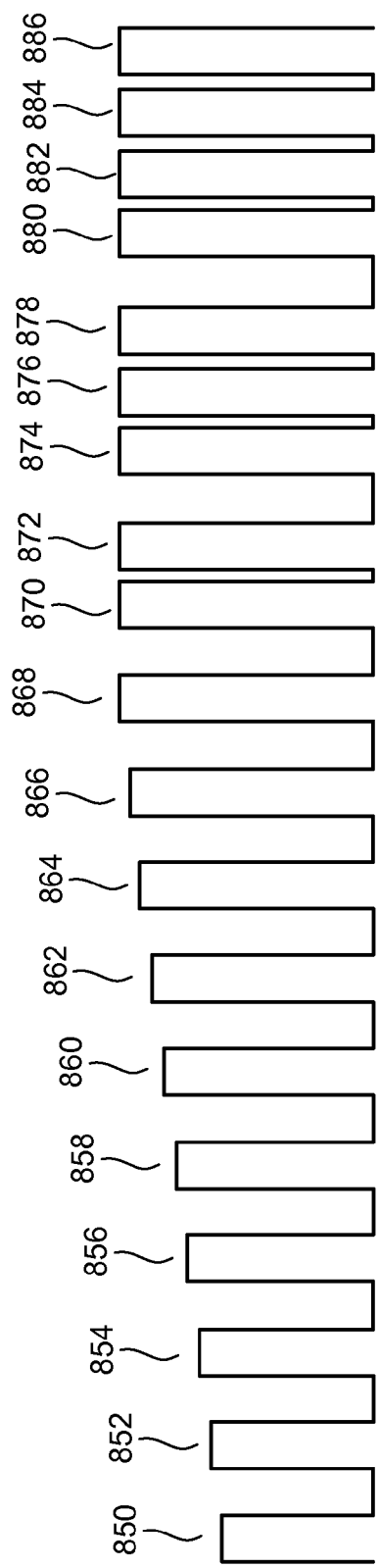
FIGS. 15-16 depict example waveforms.

FIG. 15 provides a graphical representation of an example of a programming signal according to the embodiment of FIG. 11C. Programming pulses 850, 852, 854, 856, 858, 860, 862, 864, 866, and 868 represent pulses that have a fixed pulse width and magnitudes that increase by a fixed step size. The magnitude of pulse 868 is at the maximum program voltage. Looking back at FIG. 10, prior to applying pulse 868, step 620 will always result in proceeding to step 622 and increasing the magnitude by the step size (and keeping the pulse width constant). After applying pulse 868 and performing verification, step 620 will result in performing step 624, at which time the system will configure itself to apply two pulses 870 and 872. Both pulses 870 and 872 are at the maximum program voltage and the same pulse width as the previous pulses (however, other pulse widths and magnitudes can be used). The next time step 624 is performed, the system will configure itself to apply three pulses 874, 876, and 878. The next time step 624 is performed, the system will configure itself to apply four pulses 880, 882, 884, 886. And so on.

Figure 16:
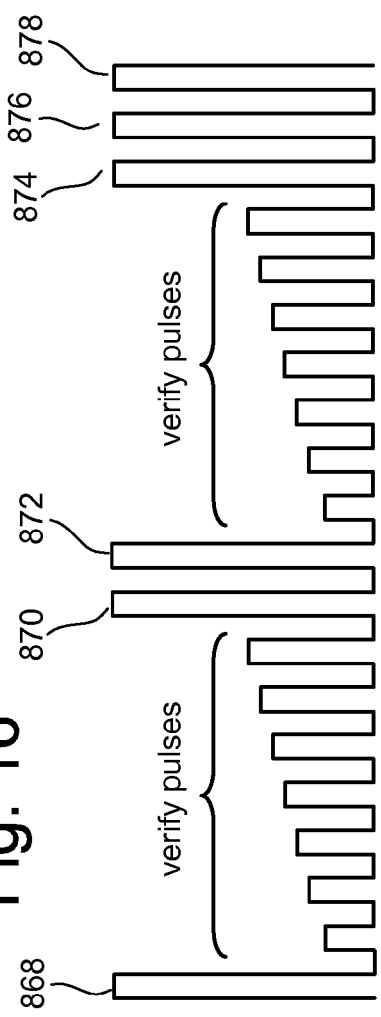

Between sets of program pulses (e.g., 870/872 are a set, 874/875/878 are examples of sets) verify operations are performed and within sets of program pulses verify operations are not performed. Therefore, this embodiment achieves a longer duration of the effective program signal by utilizing multiple program pulses between verify operations. For example, between program pulse 868 and program pulse 870, one or more verify operations are performed. For example, FIG. 16 shows seven verify operations (corresponding to seven verify pulses) being performed between program pulse 868 and program pulse 870. In between program pulse 870 and program pulse 872 no verify operations are performed. In between program pulse 872 and program pulse 874, one or more verify operations are performed. For example, FIG. 16 shows seven verify operations (corresponding to seven verify pulses) being performed between program pulse 872 and program pulse 874. In between program pulses 874, 876 and 878, no verify operations are performed. The verify operations are also performed between each of the program pulses 850, 852, 854, 856, 858, 860, 862, 864, 866, and 868.

In an alternative embodiment to the pulse signal of FIG. 11C and FIG. 15, each set of pulses (e.g., 870/872 are a set, 874/875/878 are examples of sets) can have their magnitude set so that the combined duration of the pulses within a set in conjunction with the magnitude provides a targeted amount of programming. In one embodiment, the number of pulses in a set and the magnitude of the number of pulses in a set can be determined from user configurable parameters (see FIG. 11B) and/or can be set to achieve constant amount of programming in each set (and, optionally, that is also the same amount of programming as each pulse 850-868).

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
   a non-volatile storage element; and
   one or more managing circuits in communication with said non-volatile storage element, said one or more managing circuits program said non-volatile storage element by applying a programming signal to said non-volatile storage element including applying programming pulses with a constant width to said non-volatile storage element prior to one or more pulses reaching a maximum magnitude and applying one or more programming pulses to said non-volatile storage element that provide varying time duration of said programming signal between verification operations subsequent to one or more pulses reaching said maximum magnitude.

2. A non-volatile storage system according to claim 1, wherein:
   said programming pulses with said constant width are applied by said one or more managing circuits with increasing magnitudes.

3. A non-volatile storage system according to claim 1, wherein:
   said applying one or more programming pulses to said non-volatile storage element that provide varying time duration of said programming signal includes said one or more managing circuits applying one or more programming pulses with varying pulse widths.

4. A non-volatile storage system according to claim 1, wherein:
said applying one or more programming pulses to said non-volatile storage element that provide varying time duration of said programming signal includes said one or more managing circuits applying one or more programming pulses with increasing pulse widths.

5. A non-volatile storage system according to claim 1, wherein:
said applying one or more programming pulses to said non-volatile storage element that provide varying time duration of said programming signal includes said one or more managing circuits applying one or more programming pulses with pulse widths that increase by a variable value.

6. A non-volatile storage system according to claim 1, wherein:
said applying one or more programming pulses to said non-volatile storage element that provide varying time duration of said programming signal includes said one or more managing circuits applying one or more programming pulses with pulse widths that increase by a constant value.

7. A non-volatile storage system according to claim 1, wherein:
said applying one or more programming pulses to said non-volatile storage element that provide varying time duration of said programming signal includes said one or more managing circuits applying one or more programming pulses with increasing pulse widths and said maximum magnitude.

8. A non-volatile storage system according to claim 1, wherein:
said applying one or more programming pulses to said non-volatile storage element that provide varying time duration of said programming signal includes said one or more managing circuits applying multiple pulses between verification operations.

9. A non-volatile storage system according to claim 1, wherein:
said applying one or more programming pulses to said non-volatile storage element that provide varying time duration of said programming signal includes said one or more managing circuits applying multiple pulses at said maximum magnitude between verification operations.

10. A non-volatile storage system according to claim 1, wherein:
said non-volatile storage element is a flash memory device.

11. A non-volatile storage system according to claim 1, wherein:
said non-volatile storage element is a multi-state flash memory device.

12. A non-volatile storage system according to claim 1, wherein:
said non-volatile storage element is a NAND multi-state flash memory device.

13. A non-volatile storage system according to claim 1, wherein:
said one or more managing circuits include any one or a combination of a controller, a state machine, a power control circuit, a command circuit, a control circuit and decoder circuits.

14. A non-volatile storage system according to claim 1, further comprising:
additional non-volatile storage elements; and
a word line connected to said one or more managing circuits, a control gate of said non-volatile storage element and control gates of said additional non-volatile storage elements,
said one or more managing circuits apply said programming signal to said control gates of said non-volatile storage element and said control gate of said additional non-volatile storage elements via said word line.

15. A non-volatile storage system, comprising:
a plurality of non-volatile storage elements;
means for applying a programming signal as a set of pulses to said plurality of non-volatile storage elements; and
means for performing one or more verification operations to determine if said non-volatile storage elements have been properly programmed, said means for applying said programming signal as said set of pulses applies pulses with increasing magnitudes and with a fixed pulse width between verification operations prior to one or more pulses reaching a maximum magnitude, said means for applying said programming signal as said set of pulses varies time duration of said programming signal between verification operations subsequent to one or more pulses reaching said maximum magnitude.

16. A non-volatile storage system, comprising:
a non-volatile storage element; and
one or more managing circuits in communication with said non-volatile storage element, said one or more managing circuits apply a set of programming pulses with increasing magnitudes and a constant pulse width to a non-volatile storage element until one or more pulses reaches a maximum magnitude, said one or more managing circuits apply a set of one or more programming pulses to said non-volatile storage element with changing pulse widths subsequent to one or more pulses reaching said maximum magnitude.

17. A non-volatile storage system according to claim 16, wherein:
said one or more managing circuits apply said programming pulses with increasing pulse widths to multiple flash memory devices, including said non-volatile storage element, via a common word line.

18. A non-volatile storage system according to claim 16, wherein:
said programming pulses with increasing pulse widths have pulse widths that increase by a varying amount.

19. A non-volatile storage system according to claim 16, wherein:
said programming pulses with increasing pulse widths have pulse widths that increase by a customizable amount.

20. A non-volatile storage system, comprising:
a plurality of non-volatile storage elements; and
one or more managing circuits in communication with said non-volatile storage elements, said one or more managing circuits apply a set of programming pulses with increasing magnitudes and a constant pulse width to said non-volatile storage elements until one or more pulses reaches a maximum magnitude and then apply one or more groups of different numbers of programming pulses to said non-volatile storage element, each group is applied between verify operations.

21. A non-volatile storage system according to claim 20, wherein:

said one or more groups of different numbers of programming pulses includes a first group, a second group and a third group;
said first group includes two pulses at said maximum magnitude;
said second group includes three pulses at said maximum magnitude; and
said third group includes four pulses at said maximum magnitude.

22. A non-volatile storage system according to claim 20, further comprising:
a control line connected to control gates of said plurality of non-volatile storage element and connected to said one or more managing circuits, said one or more managing circuits apply said programming pulses to said plurality of non-volatile storage element via said control line.

* * * * *